United States Patent [19]

Gloaguen

[11] Patent Number: 4,532,441
[45] Date of Patent: Jul. 30, 1985

[54] OUTPUT STAGE FOR A TEMPERATURE-COMPENSATED INTEGRATED E.C.L. CIRCUIT

[75] Inventor: Gilbert Y. M. Gloaguen, Evrecy, France

[73] Assignee: U.S. Philips Corporation, New York, N.Y.

[21] Appl. No.: 451,995

[22] Filed: Dec. 21, 1982

[30] Foreign Application Priority Data

Dec. 30, 1981 [FR] France ................. 81 24475

[51] Int. Cl.³ ............... H03K 19/086; H03K 19/20; H03K 17/14
[52] U.S. Cl. .................................. 307/455; 307/297; 307/310
[58] Field of Search ........... 307/443, 445, 455, 467, 307/475, 200 A, 270, 296 R, 297, 310

[56] References Cited

U.S. PATENT DOCUMENTS

| 3,560,770 | 2/1971 | Gieles | 307/310 X |
| 4,249,091 | 2/1981 | Yamagiwa | 307/310 X |
| 4,329,597 | 5/1982 | Yamagiwa | 307/310 X |

*Primary Examiner*—Stanley D. Miller
*Assistant Examiner*—David R. Bertelson
*Attorney, Agent, or Firm*—Robert T. Mayer; Steven R. Biren

[57] ABSTRACT

An output stage comprising a differential amplifier ($T_1$, $T_2$) which comprises an additional current source (20) which conducts, via a transistor ($T_4$) which is connected parallel to the base and the collector of one of the transistors ($T_1$) of the differential amplifier, an auxiliary current through the load resistor (1) of the transistor ($T_1$). A further branch of said current source 20 is formed by a transistor ($T_5$) which is connected in series with a resistor (3), the conduction of the transistor ($T_5$) being (indirectly) controlled by the current flowing through a resistor (2) which is connected between the transistor ($T_4$) and the source (20).

7 Claims, 3 Drawing Figures 4,532,441

OUTPUT STAGE FOR A TEMPERATURE-COMPENSATED INTEGRATED E.C.L. CIRCUIT

BACKGROUND OF THE INVENTION

The invention relates to an output stage for an integrated E.C.L. circuit, said output stage comprising:

a first and a second transistor which are interconnected by way of their emitters and which form a differential circuit which is connected to a first power supply line and which is connected in series with a first current source to which the emitters of both transistors are connected and which is connected to a second power supply line, the collector of the first transistor being connected to the first power supply line via a first resistor, a third transistor whose emitter forms the output of the circuit and whose base is connected to said first resistor and the collector of the first transistor, a fourth transistor whose base and collector are connected parallel to the base and the collector, respectively, of the first transistor and whose emitter circuit comprises a second current source which is connected to the second power supply line.

Herein, the letters "E.C.L." indicate a technique which is known from the field of logic integrated circuits; these letters correspond to the initial letters of the words "Emitter Coupled Logic".

The output levels 0 (low) and 1 (high) should be accurate and as stable as possible voltage levels in a logic circuit. The voltage levels on the output, however, inevitably vary as the operating temperatures of the elements of the circuits vary, notably the temperatures of the p-n junctions of the transistors of this circuit. Therefore, logic circuits are customarily "temperature-compensated" in order to restrict such output voltage variations.

A circuit designed for this purpose and intended for the output stage of an E.C.L. circuit is shown in FIG. 4 of an article published in the magazine "IEEE Journal of Solid Stage Circuits" (Vol. SC 14, No. 5, October 1979). This circuit is based on the use of a current source (corresponding to the "second current source" as indicated above) which supplies an auxiliary current $I_4$ which flows via a resistor (the "first resistor" above) and which causes a voltage drop across this resistor whose variation has an opposite polarity with respect to the variation of the base-emitter voltage $V_{BE}$ of the output transistor ("third transistor"). Because, when taken with respect to the general reference potential (the potential of the power supply line to which said transistor is connected), the output level equals the sum of the voltage drop across this resistor and $V_{BE}$ of the output transistor and because these two parameters vary in opposite directions as a function of the temperature, a given compensation can be achieved. Actually, beyond a given temperature (approximately 60°) of the p-n junctions of the transistors overcompensation occurs, the increase of the voltage drop in the transistor then being larger than the amount whereby the $V_{BE}$ of the output transistor decreases; thus, the voltage level of the high and the low output levels decreases as the temperature increases.

SUMMARY OF THE INVENTION

It is an object of the invention to provide an output stage for an integrated logic circuit in which "overcompensation" is suppressed.

An output stage for an integrated E.C.L. circuit as described above is characterized in accordance with the invention in that:

a second resistor is connected between the second current source and the emitter of the fourth transistor, a third resistor is connected in series with the emitter-collector path of a fifth transistor between said second current source and the first power supply line, the collector of said fifth transistor being directly connected to said first power supply line while its base is at least indirectly connected to the emitter of the fourth transistor.

The device in accordance with the invention is based on the simple idea that, because of the fact that the voltage drop across said resistor becomes excessively large beyond a given temperature, beyond this temperature a part of the current $I_4$ flowing through this resistor must be branched off.

The operation of the temperature-compensation circuit can be summarized as follows:

the current paths of the second current source, being formed on the one hand by the third resistor in series with the E.B.-path (emitter-base path) of the fifth transistor and on the other hand by the second resistor in series with the E.B.-path of the fourth transistor which in its turn is connected in series with the first resistor, are connected in parallel. The current flows permanently via the latter of said two current paths. However, the current can flow via the other current path (third resistor+fifth transistor) only if the base-emitter voltage $V_{BE}$ of the fifth transistor is sufficiently high. The value of this voltage $V_{BE}$ is dependent notably on the value of the voltage drop across the second resistor which in its turn is dependent on the value of the current which is supplied by the second source and which increases as the operating temperature increases. At low temperatures, the voltage drop across the second resistor is not large enough for the voltage $V_{BE}$ of the fifth transistor to reach its threshold value, so that no current flows through this transistor. When, after a rise of the operating temperature, the value of the current of the second source becomes sufficiently high for the voltage $V_{BE}$ of the fifth transistor to reach the threshold value due to the increased voltage drop across the second resistor, a current starts to flow through said fifth transistor. This current is subtracted from the current flowing via the current path in which the first resistor is included and decreases as the temperature is higher. Thus, the rate of increase of the voltage drop across the first resistor as a function of the temperature can be limited and this increase can be made substantially equal (except for the sign) so that the voltage $V_{BE}$ of the third transistor; consequently, the high and low levels of the output potential of the stage are stabilized.

The third resistor, being connected in series with the fifth transistor, produces the impedance required to ensure that the current of the second source cannot flow substantially completely through the fifth transistor as soon as the latter becomes conductive; otherwise, not only would the control system be paralized, but also large voltage differences between the high and low output levels would be precluded.

An E.C.L. output stage comprising a temperature control device of the described kind offers the advantage that the output voltage produced thereby is very stable within a wide range of operating temperatures which lies between 30° C. and 150° C. in as far as the p-n junctions are concerned. By a suitable choice of the elements of this device it a variation of ±5 mV of the output voltages is not exceeded between the extreme limits of said junction temperatures. The control system operates identically for both (high and low) output levels of the stage.

Taking into account its high effectiveness, the device also offers the advantage of simplicity.

In a first embodiment of the device in accordance with the invention, the base of the fifth transistor is connected directly to the emitter of the fourth transistor, The device comprises a control resistor (second resistor) whereto the base-emitter path of the fifth transistor is connected in parallel in series with a resistor (third resistor). The value of the voltage $V_{BE}$ of the fifth transistor is then completely dependent on the voltage drop across the second resistor. Considering the small currents used, the second resistor must be rather large (approximately one kilo-ohm on the average).

In a slightly more complex second embodiment of the device, the base of the fifth transistor is connected to the center of a resistance bridge which is connected between the second current source and the bases of the first and the fourth transistor. The connection in accordance with the invention between said base of the fifth transistor and the emitter of the fourth transistor is indirect in this case. This is because a first resistor of said resistance bridge and the second resistor in the base-emitter path of the fourth transistor are included in this connection.

In this second embodiment, the value of the voltage $V_{BE}$ of the first transistor does not depend exclusively on the voltage drop across the second resistor. The variations of the latter voltage drop are added to a prepolarization voltage derived from said resistance bridge. However, the stage of the fifth transistor is still controlled by the voltage drop across the second resistor. This embodiment enables on the one hand the use of a second resistor whose value is three to four times smaller than in the foregoing case, so that the voltage drop across this resistor is limited, and on the other hand allows for an increase of the potential level on the side of the second resistor which is connected to the second current source; said second current source thus operates under more favorable circumstances.

Regardless of the embodiment chosen, in order to obtain optimum results it is necessary to use not only given resistance values of the relevant resistors, but also given ratios of the resistances of these resistors. This will be explained, along with the operation of the control device, with reference to the drawings.

DESCRIPTION OF THE PREFERRED EMBODIMENTS

Figure 1:
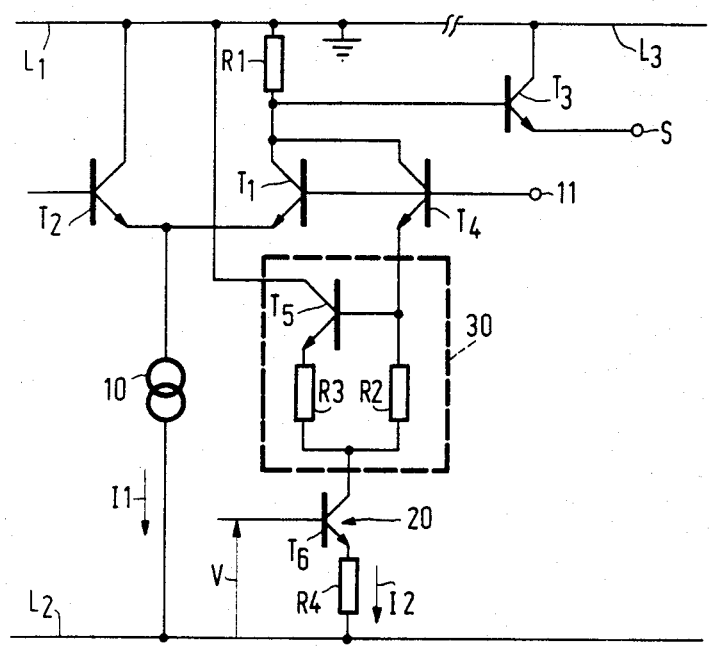
FIG. 1 shows the diagram of an E.C.L.-output stage which comprises a first embodiment of the control device in accordance with the invention.
Figure 2:
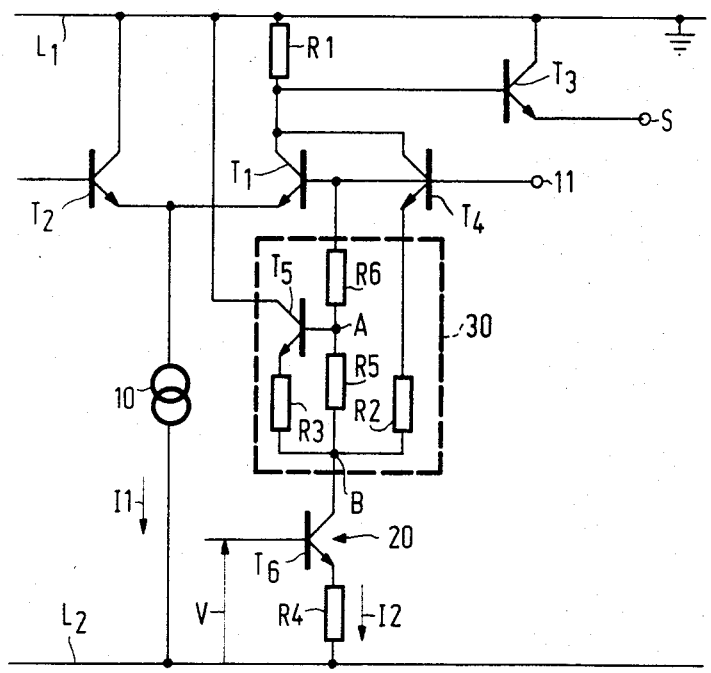
FIG. 2 shows the diagram of the same E.C.L. output stage comprising a second embodiment of the control device.

The FIGS. 1 and 2 clearly show the basic elements of the diagram of an output stage for a gate network according to the E.C.L. technique. These elements are first of all the two transistors $T_1$ and $T_2$ (referred to above as "first and second transistor") of the npn-type which form a differential circuit; the two emitters are connected in series with a current source 10 ("first current source") which in its turn is connected to a power supply line $L_2$ ("second power supply line"); furthermore, the collector of $T_1$ and the collector of $T_2$ are connected, the former via a resistor $R_1$ ("first resistor"), to a power supply line $L_1$ ("first power supply line") which is generally connected to ground and whose potential is generally used as the reference potential. The input signals are applied, for example, to the base of the transistor $T_2$. The base of the transistor $T_1$ is connected to a fixed auxiliary voltage source which is denoted only by a circle 11. A transistor $T_3$ of the npn-type, being connected as an emitter follower with respect to the transistor $T_1$, forms the output element of the stage: the base of the transistor $T_3$ is connected to the collector of the transistor $T_1$, its collector being connected to a separate power supply line $L_3$; on its emitter (terminal S) the output voltages appear. It is alternatively possible to connect the collector to the first power supply line $L_1$. All this is known from the prior art. (For the sake of clarity, this separate power supply line $L_3$ has been omitted in FIG. 2).

In a complementary circuit for compensating for the variations of the output voltages caused by variations of the operating temperatures of the output stage there is included an npn-type transistor $T_4$ (fourth transistor) whose base and collector are connected to the base and the collector, respectively, of the transistor $T_1$ and whose emitter is connected to the line $L_2$, via a current source 20 ("second current source"). This second current source 20 comprises in a known manner a transistor $T_6$ of the npn-type whose base receives a constant voltage V, a resistor $R_4$ being connected in its emitter circuit.

For the sake of clarity, the well-known part of the diagram which comprises the current source 10 is shown in simplified form: the current source 10 which is not involved in the operation of the temperature compensation device is merely diagrammatically shown in the Figures.

The device in accordance with the invention which ensures, in conjunction with the transistor $T_4$ and the current source 20, that the output voltage on S remains substantially stable throughout a wide range of operating temperatures, is denoted by a rectangle 30 of interrupted lines in the FIGS. 1 and 2. According to a diagram which is applicable to each of the two embodiments in accordance with the invention (as shown in the FIGS. 1 and 2), they are generally characterized in that:

"a second resistor R2 is connected between the second current source 20 and the emitter of the fourth transistor $T_4$, a third resistor $R_3$ being connected in series with the emitter-collector path of a fifth transistor $T_5$ between said second current source 20 and the first power supply line $L_1$, the collector of said fifth transistor $T_5$ being directly connected to the first power supply $L_1$, while its base is at least indirectly connected to the emitter of the fourth transistor $T_4$".

The description of the operation of the device in accordance with the invention will be preceded by a description of the operation of the known basic control circuit which is formed by the current source 20 and the transistor T$_4$. In this respect reference is made to the FIGS. 1 and 2, the circuits indicated by the rectangles 30 being ignored for the time being. A typical prior-art circuit is shown in U.S. Pat. No. 3,579,272.

It is known that the output voltage on the terminal S, when measured with respect to the voltage of the line L$_1$ which serves as the general reference voltage, may have two levels, that is to say V$_H$ (high level) and V$_B$ (low level) which correspond to the flowing of the current I$_1$ supplied by the source 10 through the transistor T$_2$ and T$_1$, respectively, of the differential circuit. The source 20 produces a current I$_2$ which flows to the resistor R$_1$ via the transistor T$_4$. This means that:

$$V_H = V_{BE3} + R_1 I_2 \qquad (1)$$

$$V_B = V_{BE3} + R_1(I_1 + I_2) = V_H + R_1 I_1$$

V$_{BE3}$ is the base-emitter voltage of the transistor T$_3$.

If R$_1$ I$_1$ is maintained very constant with temperature (this is achieved in E.C.L. circuits by known means and is considered as an established fact herein), evidently the same parameters are applicable to the value of V$_H$ and V$_B$. In formula (1), both terms V$_{BE3}$ and R$_1$ I$_2$ vary in opposite directions as a function of temperature; the former term decreases and the latter term increases, so that a given compensation is achieved. Consequently, the stability of V$_H$ (and hence also of V$_B$) is improved by the use of an auxiliary current I$_2$. However, this compensation is imperfect, because R$_1$I$_2$ increases more than V$_{BE3}$ decreases when the temperature rises. The factors of this lack of balance can be distinguished by means of the following calculation.

$$I_2 = (V - V_{BE6})/R_4$$

In this equation, V is the potential of the base of T$_6$ which has been stabilized with respect to the line L$_2$, R$_4$ is the value of the resistor 4, and V$_{BE6}$ is the base-emitter voltage of the transistor T$_6$.

$$R_1 I_2 = (R_1/R_4) \cdot V - (R_1/R_4) \cdot V_{BE6}$$

When this formula for R$_1$I$_2$ is inserted in the equation (1) for V$_H$:

$$V_H = V_{BE3} + (R_1/R_4) \cdot V - (R_1/R_4) \cdot V_{BE6} \qquad (2)$$

The term $(R_1/R_4) \cdot V$ is constant, V being assumed to be constant and the ratio R$_1$/R$_4$ also assumed to be constant due to a proportional variation as a function of temperature of the values of the resistors R$_1$ and R$_4$. The variation of V$_H$ is dependent on the variations of the two other terms of the equation (2). In order to keep V$_H$ stable, it is necessary that $$dV_{BE3}/dT^\circ = (dV_{BE6}/dT^\circ) \cdot (R_1/R_4)$$

(T°: operating temperature).

Now, $dV_{BE3}/dT^\circ$ is constant, because the transistor T$_3$ generally operates with a constant current on its output; the temperature coefficient thereof (in mV base-emitter voltage variation per degree), therefore, remains constant to a high degree, regardless of the operating temperature. This is not applicable to $$dV_{BE6}/dT^\circ$$

because the temperature coefficient of the transistor T$_6$ varies together with the current I$_2$ produced by this transistor.

Therefore, it cannot be avoided that R$_1$·I$_2$ increases faster than V$_{BE3}$ decreases, and the output levels V$_H$ and V$_B$ (see equation 1) tend to decrease when the temperature rises. Actually, the decrease of the voltage V$_{BE3}$ is overcompensated for by the increase of R$_1$I$_2$. Using the additional device in accordance with the invention, this overcompensation phenomenon can be suppressed and a very high stability of said output levels can be achieved. Both embodiments of this additional device in accordance with the invention (the circuit of FIG. 1 as well as that of FIG. 2) serve to ensure that a part of I$_2$ which becomes larger as the temperature is higher is branched off to L$_1$ so that it cannot flow through the resistor R$_1$. The increase of the voltage drop across the first resistor can thus be adapted to the decrease of V$_{BE3}$.

In the first embodiment of the device in accordance with the invention (see FIG. 1, rectangle 30), the base of the transistor T$_5$ is connected directly to the emitter of the transistor T$_4$. The device thus comprises a resistor R$_2$ whereacross the base-emitter path of the transistor T$_5$ is connected in series with the resistor R$_3$.

The operation of the device is as follows: The voltage V$_{BE}$ of the transistor T$_5$ is dependent on the voltage across the resistor R$_2$. At lower temperatures (up to approximately 60° C.) where I$_2$ has the lower level, the voltage R$_2$·I$_2$ is lower than the threshold voltage V$_{BE}$ of the transistor T$_5$ which is thus turned off. All of the current I$_2$ thus flows through the resistor R$_1$ via the transistor T$_4$. When the product R$_2$·I$_2$ reaches the threshold voltage V$_{BE}$ of the transistor T$_5$, the latter is turned on; from this instant a part of the current I$_2$ is branched off via the transistor T$_5$ and the resistor R$_3$ and this part is subtracted from the current previously flowing through the resistor R$_1$. The voltage drop R$_1$·I$_2$ is thus limited, so that the object is achieved. Because I$_2$ increases as the temperature increases, the voltage drop across the resistor R$_2$ increases and the voltage V$_{BE}$ of the transistor T$_5$ increases, so that the current flowing through this transistor increases.

As has already been indicated, the presence of the resistor R$_3$ in series with the emitter-collector path of the transistor T$_5$ prevents the entire current I$_2$ from flowing through the transistor T$_5$ as soon as the latter is turned on.

The control accuracy thus obtained for the output levels on point S is dependent, in accordance with the temperature, on the values used for each of the resistors R1, R2, R3 and R4 and also on the ratios of the values of these resistors. Calculations and tests performed on the described embodiment in accordance with the invention have demonstrated that said resistors should be chosen so that the following equations are satisfied:

R$_1$/R$_4$ = from 2.8 to 3.2 and

R$_3$/R$_4$ = from 1.4 to 1.8.

In a second embodiment of the device in accordance with the invention (see FIG. 2, rectangle 30), the base of the fifth transistor T$_5$ is connected to the center A of a resistance bridge R$_5$-R$_6$ which is connected between the second current source 30 and the bases of the transistors $T_1$ and $T_4$ (or the fixed auxiliary current source 11 in the case of the Figure). The base of the transistor $T_5$ is indirectly connected to the emitter of the transistor $T_4$, that is to say via the resistor $R_6$ of said bridge and the base-emitter path of the transistor $T_4$. The value of the voltage $V_{BE}$ of the transistor $T_5$ in this second embodiment no longer depends exclusively on the value of the voltage drop across the resistor $R_2$. A component which depends on the variations of the voltage drop across said resistor $R_2$ is added to a component of $V_{BE5}$ which is determined by the resistance bridge $R_5$-$R_6$; these variations depend on the variations of $I_2$ and cause variations of the potential level on the collector of the transistor $T_6$ (at point B in FIG. 2) with influences the emitter of the transistor $T_5$ and causes variations of $V_{BE5}$. It is to be noted that the potential at point A varies in the same direction as the potential at point B, but the amplitude is lower.

In a circuit of this kind in which the voltage drop across the resistor $R_2$ is no longer the sole factor determining the value of the voltage $V_{BE5}$ such as in the former embodiment, the value of said resistor $R_2$ is chosen to be smaller than in the latter case. Because the voltage drop across the resistor $R_2$ is smaller, the potential on the collector of the transistor $T_6$ is higher than in the case of FIG. 1, so that the risk of saturation of this transistor $T_6$ is reduced; this is because the desired temperature compensation can be achieved only when transistor $T_6$ operates in the nonsaturated state.

For a suitable operation of the circuit shown in FIG. 2, given ratios of the resistors in this circuit must be used. It is to be ensured that $R_3/R_2$ = from 1.0 to 1.3 and $R_5/R_6$ = from 1.8 to 2.2.

For the above description of the operation of the device in accordance with the invention it has been assumed that the input signals are applied to the transistor $T_2$ of the differential circuit, while the base of the transistor $T_1$ of this differential circuit (and hence also that of the transistor $T_4$) is connected to a fixed current source 11. It is to be noted that the opposite case could be chosen; the input signals are then applied to the base of the transistor $T_1$ (and to the base of the $T_4$) while the base of the transistor $T_2$ is connected to the source 11.

As regards the manufacture of the E.C.L. stage in a semiconductor structure, it will be clear to those skilled in the art that the transistors $T_1$ and $T_4$ which are separately shown in the FIGS. 1 and 2 can be combined in order to form a single transistor comprising a double emitter.

Figure 3:
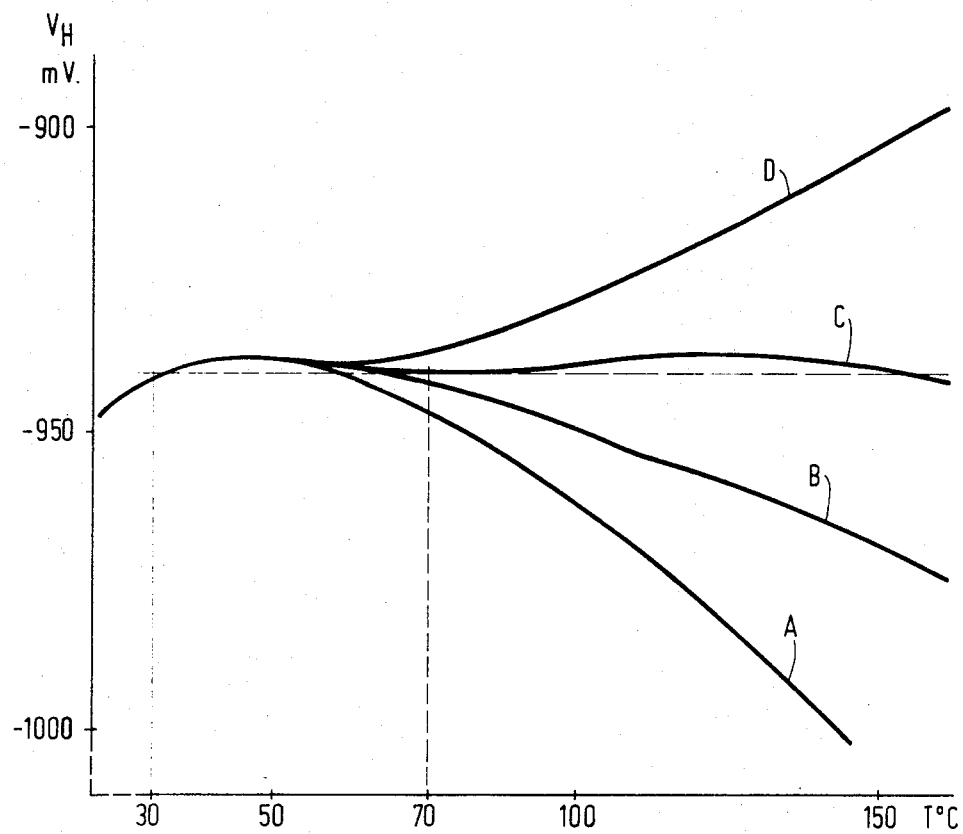
FIG. 3 shows a graph with the variations of the output voltage of an E.C.L. stage as a function of the operating temperature.

FIG. 3 shows a graph with four curves which represent the variation of the output voltage $V_H$ of an E.C.L.-stage as shown in FIG. 1, said voltage having been measured in millivolts (calculated in negative values with respect to the zero potential of the reference line $L_1$, the power supply line $L_3$ carrying the same potential) as a function of the temperature of the semiconductor crystal on which said stage is mounted in a temperature range from 30° to 150° C. for the following cases:
 curve A: output stage without correction device 30.
 curves B, C, D: output stage comprising a correction device 30, the values of the resistors R1, R2 and R4 being fixed and the resistor R3 having three different values.

The curve A shows how the output voltage regularly decreases after a short, flat portion at low operating temperatures (approximately from 30° to 60° C.), the rate at which the curve drops being higher as the temperature increases.

For the stage comprising the device 30 in accordance with the invention, the curves B, C and D illustrate that $V_H$ has a suitable stability between approximately 30° C. and 70° C. Above 70° C., the three curves diverge, each curve having a different slope which is related to a given value of the resistor R3. The curve C which corresponds to an intermediate value of the resistor R3 which is between the higher and the lower values to which curves B and D, respectively, correspond, demonstrates that the output voltage can be substantially stabilized in the relevant temperature range by means of the device in accordance with the invention.

When the value of the resistor R3 is chosen to be too high (curve B), the part of the current I2 which is branched off via the transistor $T_5$ will be too small and the increase of the current in the resistor R1 will not be high enough to make the increase of the voltage drop across said resistor R1 larger than the decrease of the voltage $V_{BE3}$. Therefore, the output voltage $V_H$ decreases.

When the value of the resistor $R_3$ is chosen to be too small (curve D), an excessively large part of the current I2 will flow through the transistor $T_5$ and the variation of $V_{BE3}$ will be larger than the variation of the voltage drop across the resistor R1: the output voltage $V_H$ increases as the temperature increases.

What is claimed is:

1. An output stage for an integrated E.C.L. circuit, said output stage comprising:
 a first and a second transistor which are interconnected by way of their emitters and which form a differential circuit which is connected to a first power supply line and which is connected in series with a first current source to which the emitters of both transistors are connected and which is connected to a second power supply line, a selected one of the base zones of said first and second transistors forming the input of said stage, the collector of the first transistor being connected to the first power supply line via a first resistor and the collector of the second transistor being connected to said first power supply line;
 a third transistor whose emitter forms the output of the circuit and whose base is connected to said first resistor and to the collector of the first transistor and whose collector is connected to a third power supply line;
 a fourth transistor whose base and collector are connected in parallel with the base and the collector, respectively, of the first transistor and whose emitter circuit comprises a second current source which is connected to the second power supply line, characterized in that a second resistor is connected between the second current source and the emitter of the fourth transistor, a third resistor being connected in series with the emitter-collector path of a fifth transistor between said second current source and the first power supply line, the collector of the fifth transistor being directly connected to said first power supply line while its base is coupled to the emitter of the fourth transistor.

2. An output stage as claimed in claim 1, characterized in that the base of the fifth transistor is directly connected to the emitter of the fourth transistor.

3. An output stage as claimed in claim 2, characterized in that the values $R_1$, $R_2$, $R_3$ and $R_4$ of the first, the second, the third and the fourth resistor, respectively are chosen such that $R_1/R_4 =$ from 2.8 to 3.2 and $R_3/R_2 =$ from 1.4 to 1.8.

4. An output stage as claimed in claim 1, characterized in that the base of the fifth transistor is connected to the junction of a fifth and a sixth resistor, the fifth resistor and the sixth resistor being connected to the second current source and the bases of the first and the fourth transistor, respectively.

5. An output stage as claimed in claim 4, characterized in that on the one hand the values $R_2$ and $R_3$ of the second and the third resistors, respectively, are chosen so that $R_3/R_2 =$ from 1.0 to 1.3, while on the other hand the values of $R_5$ and $R_6$ of the fifth and the sixth resistor, respectively, are chosen so that $R_5/R_6 =$ from 1.8 to 2.2.

6. An output stage as claimed in claim 1, 2, 3, 4, or 5, characterized in that the base of the first transistor is connected to a fixed voltage source while the base of the second transistor forms the input of said stage.

7. An output stage as claimed in claim 1, 2, 3, 4 or 5, characterized in that the base of the second transistor is connected to a fixed voltage source, the base of the first transistor forming the input of said stage.

* * * * *